United States Patent
Kinoshita et al.

(10) Patent No.: US 7,173,397 B2
(45) Date of Patent: Feb. 6, 2007

(54) BATTERY SYSTEM, BATTERY MONITORING METHOD AND APPARATUS

(75) Inventors: Takuya Kinoshita, Hitachi (JP); Hideki Miyazaki, Hitachi (JP); Akihiko Emori, Hitachi (JP); Tetsuro Okoshi, Fukaya (JP); Tokiyoshi Hirasawa, Hiki (JP)

(73) Assignees: Hitachi, Ltd., Tokyo (JP); Shin-Kobe Electric Machinery Co., Ltd., Tokyo (JP)

( * ) Notice: Subject to any disclaimer, the term of this patent is extended or adjusted under 35 U.S.C. 154(b) by 133 days.

(21) Appl. No.: 10/785,408

(22) Filed: Feb. 25, 2004

(65) Prior Publication Data
US 2004/0251875 A1    Dec. 16, 2004

(30) Foreign Application Priority Data
Jun. 10, 2003    (JP) ............................ 2003-164725

(51) Int. Cl.
*H02J 7/00*    (2006.01)
*G01N 27/416*    (2006.01)

(52) U.S. Cl. ...................................... 320/134; 324/433

(58) Field of Classification Search .............. 320/134; 324/433
See application file for complete search history.

(56) References Cited

U.S. PATENT DOCUMENTS

| | | | |
|---|---|---|---|
| 5,675,258 A * | 10/1997 | Kadouchi et al. | 324/433 |
| 6,624,533 B1 * | 9/2003 | Swanson et al. | 307/64 |
| 6,943,525 B2 * | 9/2005 | Toya et al. | 320/104 |
| 2003/0155160 A1 * | 8/2003 | Nomura et al. | 180/65.1 |

FOREIGN PATENT DOCUMENTS
JP    11-052034    2/1999

* cited by examiner

*Primary Examiner*—Karl Easthom
*Assistant Examiner*—Richard V. Muralidar
(74) *Attorney, Agent, or Firm*—Crowell & Moring LLP

(57) ABSTRACT

A battery performance monitoring system anticipates the sudden fall of battery output. The system measures the battery voltage at a time point when the discharge current of a battery becomes smaller than the reference current value or at a time point when the current to the load which is connected to the battery becomes smaller than the reference current value, and judges the battery to be abnormal if the difference of the measured battery voltage from the approximate formula in regard to the current-voltage relation in the former half of a same discharge event becomes out of the reference range.

12 Claims, 9 Drawing Sheets

BATTERY SYSTEM, BATTERY MONITORING METHOD AND APPARATUS

FIELD OF THE INVENTION

The present invention relates to a method of performance assessment of a secondary battery (will be called simply "battery" hereinafter) and battery equipment, and particularly to a system for monitoring whether a battery installed in a motor car or the like is functioning normally.

BACKGROUND OF THE INVENTION

Vehicles such as motor cars are each equipped with a lead battery as a secondary battery, and it is used as energy source of engine starting, lighting, fuel injection, etc. It is desired to anticipate the fall of output of the lead battery. If the battery does not have a sufficient power supply after the engine is stopped, it will not be able to restart the engine.

A usual 12-volt lead battery consists of six 2-volt cells connected in series. If any of the cells malfunctions and falls into the state of inverse charge, a voltage drop equal or greater by 2 volts or more than the normal state arises at the time of discharging and the battery may not be able to start the engine.

A method of anticipating the life span of a battery based on the measurement of its voltage recovery characteristics has been proposed.

A method for assessing the deterioration of battery performance based on the voltage recovery characteristics on the time axis after a large load, is described in Japanese Patent Laid-Open No. H11 (1999)-52034 (paragraph 0011 and FIG. 2).

The technique of the above-mentioned patent publication bases the assessment of performance deterioration on the time expended until the voltage at large load application is restored, and therefore the battery needs to have virtually equal load currents before and after the large load application. A car battery has no load before the engine is started, and it is charged after the engine has started. Due to a charging current after the large load application, the battery voltage soon exceeds the no-load voltage, and therefore the scheme of this patent publication cannot be used for the car battery.

In regard to the battery for the driving power source of hybrid cars (using an internal-combustion engine and a motor) and fuel cell cars, the battery characteristics cannot be measured during a run. For this reason, it is difficult to estimate a deficiency of the power supply during a run and the failure of engine restarting etc.

The present invention is intended to solve the foregoing problems, and to provide a method and apparatus for the performance assessment (monitoring) of a secondary battery for anticipating the abrupt fall of battery output.

SUMMARY OF THE INVENTION

In order to achieve the above objective, the present invention according to one aspect resides in a method of monitoring the abnormality of battery equipment which is charged to store power and discharges the stored power to a load, wherein the battery output voltage and current are measured during the power discharge to the load, the voltage recovery characteristics to the discharge current of the battery equipment is obtained from the measured voltage and current, at least the variation of recovering voltage immediately before or after the ceasing of power discharge to the load is monitored, and the abnormality of the battery equipment is diagnosed based on the monitoring result.

Here, "abnormality" refers to at lest one of defect, malfunction and failure etc. of the battery In order to achieve the above objective, the present invention according to another aspect resides in equipment of monitoring the abnormality of battery equipment which is charged to store power and discharges the stored power to a load, wherein at least the variation of the recovering voltage immediately before or after the ceasing of power discharge to the load in the discharge voltage recovery characteristics to the discharge current of the battery equipment is monitored thereby to diagnose the abnormality of the battery equipment.

In order to achieve the above objective, the present invention according to still another aspect resides in a battery system which comprises battery equipment which is charged to store power and discharges the stored power to a load, a voltage sensor which measures the charging voltage and discharging voltage of the battery equipment, a current sensor which measures the charging current and discharging current of the battery equipment, and a controller which takes in the outputs of the voltage sensor and current sensor and controls the charging and discharging of the battery equipment, wherein the controller monitors at least the variation of the recovering voltage immediately before or after the ceasing of power discharge to the load in the discharge voltage recovery characteristics to the discharge current of the battery equipment thereby to diagnose the abnormality of the battery equipment.

DESCRIPTION OF THE PREFERRED EMBODIMENTS

Embodiments of this invention will be explained in detail with reference to the drawings.

This invention has two points. The first point is determining a battery characteristics to be utilized for abnormality anticipation, and the second point is determining an algorithm of the judgment of abnormality.

A usual lead battery for starting a car engine (12-volt lead battery) consists of six lead battery cells connected in series. If these battery cells have different charge states and any battery cell falls into the state of over discharge or inverse charge during the discharge operation due to the disparity of self-discharge rate, charging efficiency, and the rise of self-discharge rate as a result of performance deterioration, there will arise such problems as inadequate discharge output and sudden deterioration of performance. On this account, it is necessary to monitor and control the battery so that all battery cells are equal in charge state and do not fall into the state of over discharge.

Figure 1:
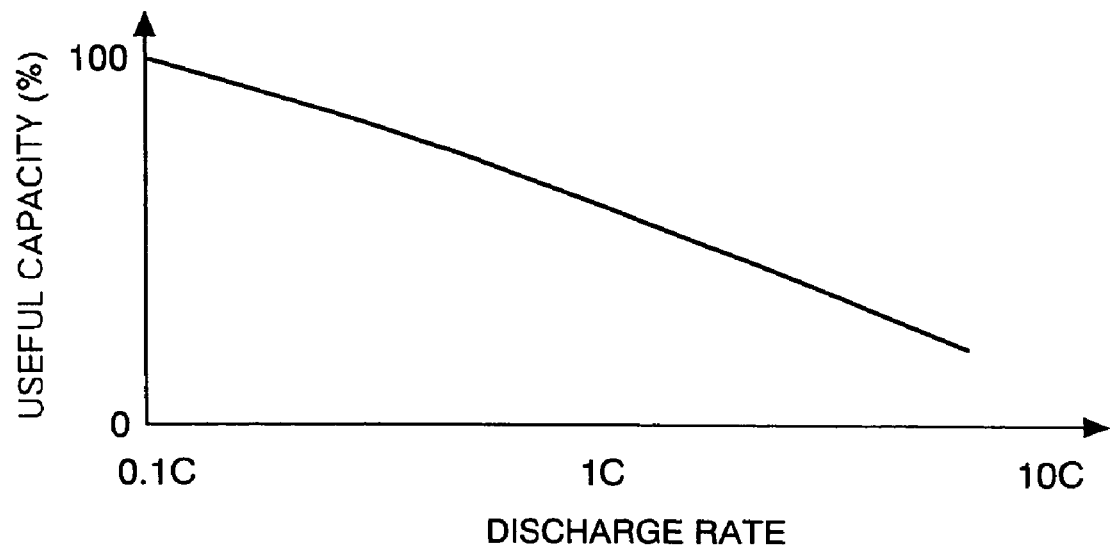
FIG. 1 is a graph showing the relation between the discharge rate and the useful storage capacity of a battery.

FIG. 1 shows the relation between the discharge rate and the usable capacity of a battery. Virtually all batteries indicate this trend. The discharge rate along the horizontal axis indicates the nominal power capacity, with a discharge current in one hour being represented by 1C. For example, a 20-Ah battery has 20-ampere discharge at 1C and 100-ampere discharge at 5C. Usual batteries have their usable capacities decreasing when they operate to discharge large currents. Batteries used for engine starting or used for hybrid cars have their load currents vary dynamically as will be explained later. Accordingly, batteries for engine starting and for hybrid cars are liable to fall into the state of over discharge or inverse charge when their usable capacities have fallen due to large-current discharging.

The inventors of the present invention have studied the voltage falling trend during a large-current discharge, and found the emergence of a unique symptom of over discharge even amid the dynamic current conduction. This is the battery characteristics as the above-mentioned first point of this invention.

Figure 2:
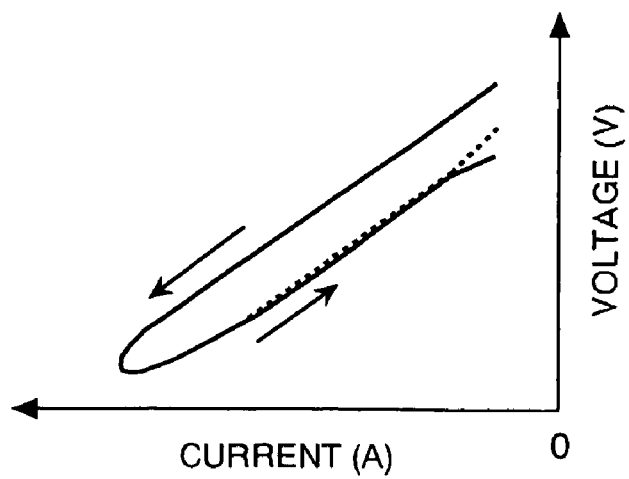
FIG. 2 is a graph showing schematically the locus of current-voltage characteristics of the battery during the engine start operation.

FIG. 2 shows schematically the locus of current-voltage characteristics during the engine start operation. When the starter motor is switched on, a steep rush current flows, causing the voltage to fall, as shown by the locus going down-leftward. The load current decreases with the increase of engine speed, causing the voltage to recover, as shown by the locus returning up-rightward. In the case of a normal battery, the locus gains the tilt angle progressively on the return path in response to the decrease of load current as shown by the dashed line. This curve is known widely as Tafel's formula of electrochemical theory. However, if any of the serial battery cells is in the terminal stage of discharging, the recovery of the battery cell deteriorates, so causing a voltage fall, and the locus takes the solid line of FIG. 2. At this stage, the battery can start the engine without a problem.

Figure 3:
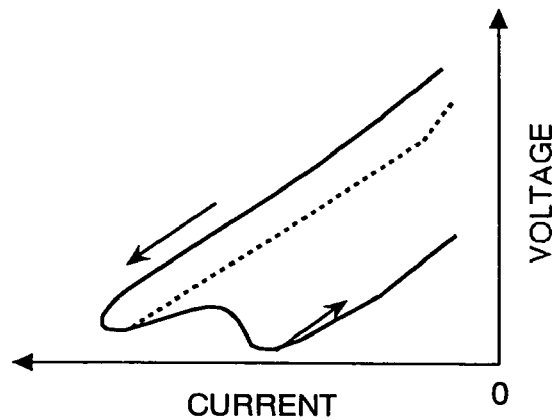
FIG. 3 is a graph showing schematically the locus of current-voltage characteristics of the battery during the engine start operation in a state of decreased charged power.

FIG. 3 shows the locus of current-voltage characteristics of the case when the state of charge has further deteriorated from the state of FIG. 2. Specifically, one of the serial battery cells falls into the state of over discharge or inverse charge, causing the battery voltage to fall by 2 to 3 volts during discharging, resulting in the failure of engine start. By anticipating the over discharge at the stage shown in FIG. 2 and charging the battery enough, it becomes possible to prevent the voltage fall as shown in FIG. 3 and ensure the engine starting.

Next, the hardware arrangement of the inventive battery equipment will be explained. The principal portion of the battery equipment is called here "battery controller".

Figure 4:
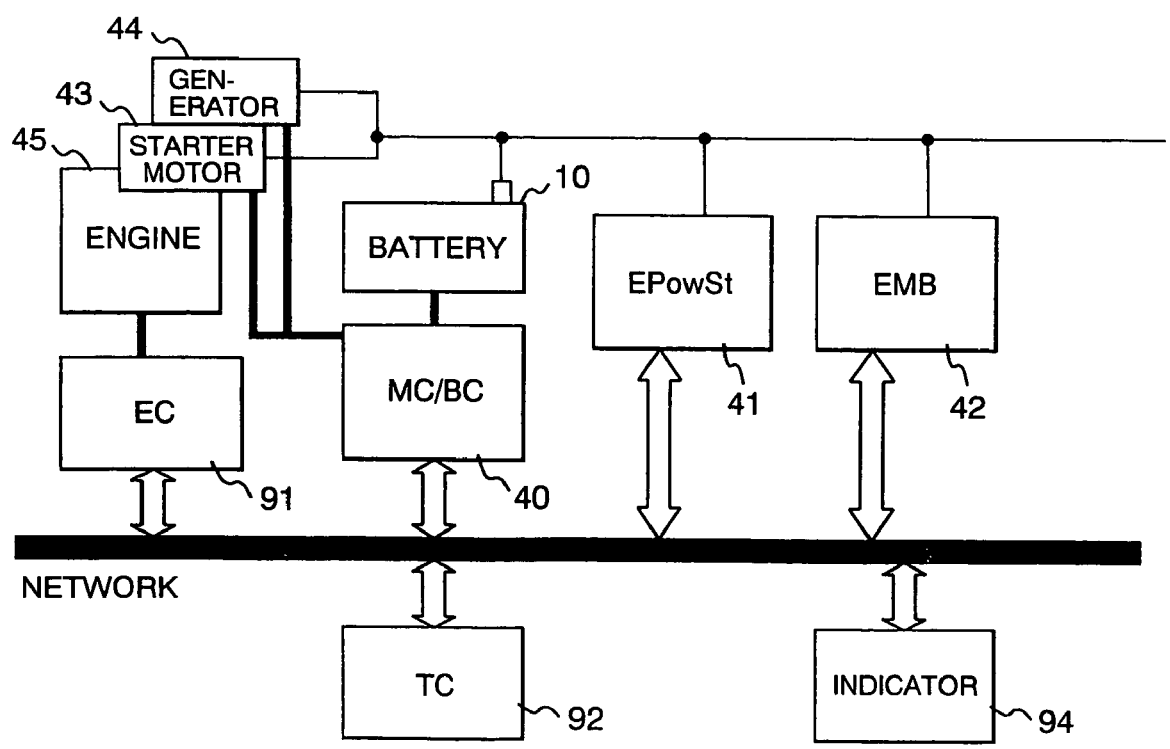
FIG. 4 is a block diagram showing the power train (drive system) of a car.

FIG. 4 shows by block diagram the power train (drive system) of a car. An engine 45, with a starter motor 43 and electric generator 44 being connected thereto, is controlled by an engine controller 91. The starter motor 43 and generator 44 are connected to a battery 10 to exchange electrical energy, and they also exchange mechanical energy with the drive shaft of the car. The starter motor 43 and generator 44 are controlled by a motor/battery controller 40, which controls energy flowing in and out among the battery 10, starter motor 43 and generator 44 and also controls the operation of the starter motor 43 and generator 44. The battery 10 is connected to the motor/battery controller 40, which monitors the state of the battery 10.

An electric power steering device 41 and electric braking device 42 are connected to the battery 10. The engine controller 91, motor/battery controller 40, total controller 92, electric power steering device 41, electric braking device 42 and indicator device 94 are connected to each other through a network. The total controller 92 issues control commands to other controllers thereby to control the car. The indicator device 94 provides operational information to the car driver.

Figure 5:
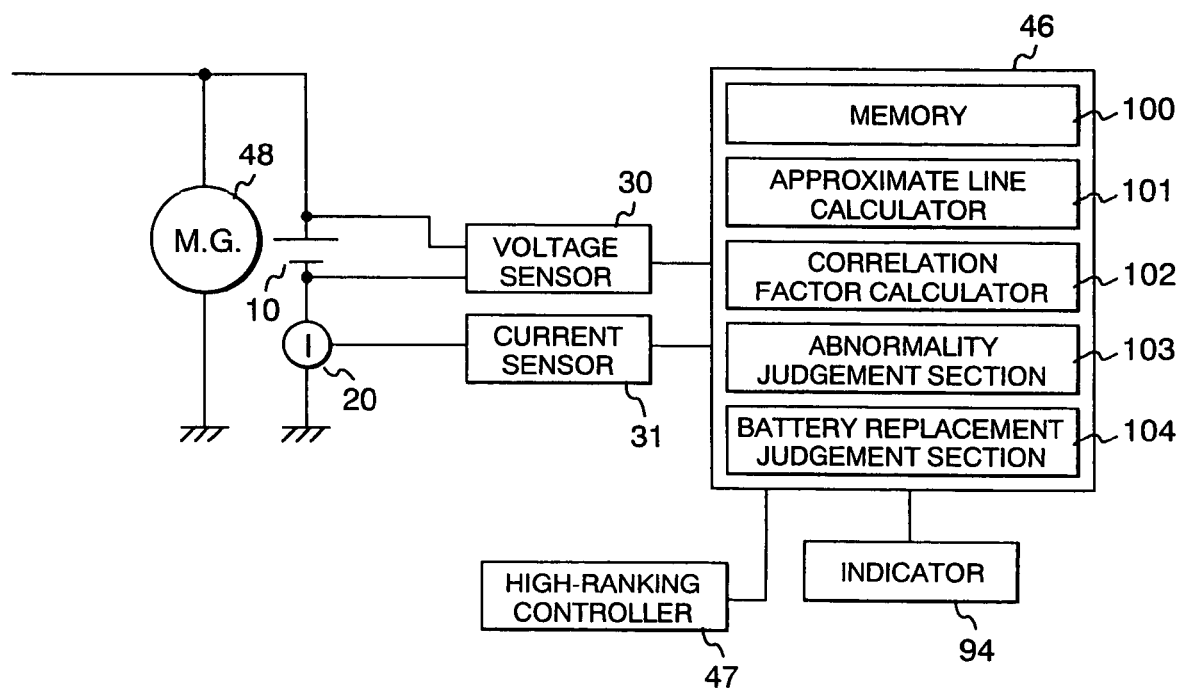
FIG. 5 is a block diagram showing the battery controller (battery equipment) and its periphery of a car based on an embodiment of this invention.

FIG. 5 shows by block diagram the battery monitoring function of the motor/battery controller 40 and its periphery. The controller is equivalent to the battery abnormality monitoring system of this invention.

A battery 10 consists of multiple battery cells connected in series. The battery 10 is connected to a motor/generator MG 48 which generically includes a motor/generator, a starter motor and a generator. A current sensor 20 converts the current of the battery 10 into a voltage signal.

A CPU 46 is a section of motor/battery controller 40 for implementing the battery monitoring function, and it includes a memory 100, approximate calculation section 101, correlation factor calculation section 102, abnormality judgment section 103 and battery replacement judgment section 104. Various calculation and control functions of the CPU 46 will be explained in detail later.

The CPU 46 takes in voltage data from a voltage sensor 30 and current data from a current sensor 31. The CPU 46 indicates abnormality information to a high-ranking controller 47 and also to the car driver through the indicator device. The high-ranking controller 47 is equivalent to the motor controller section of the motor/battery controller 40 or the total controller 92 shown in FIG. 4.

Figure 6:
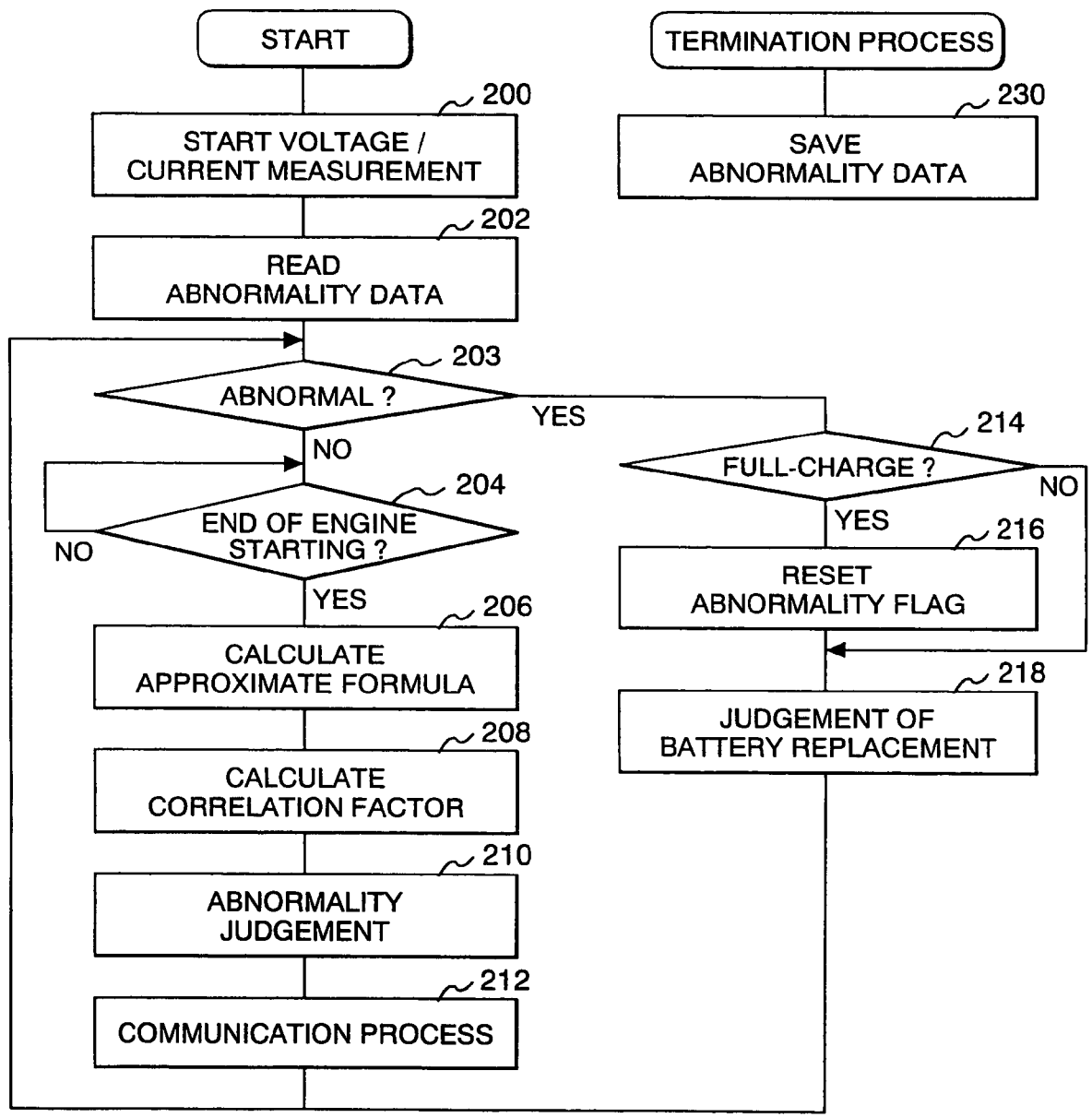
FIG. 6 is a flowchart showing the battery state detecting process based on an embodiment of this invention.

Next, the second point of this invention, i.e., a calculation method for anticipating the abnormality of battery from measurement results, will be explained. FIG. 6 shows by flowchart the processings performed by the CPU 46. Initially, processing step 200 starts the measurement of the voltage and current of the battery 10 immediately after the car ignition key is turned on. The measurement of current and voltage takes place at intervals of around 1 ms. The measured current and voltage data are memorized in the memory 100. Next, at step 202 reads abnormality data at end time of the engine in which the previous (last) ignition key switch was turned off, from the memory 100. The abnormality data has been written to the memory 100 at the previous turn-off of the ignition key at step 230.

Subsequently, the battery abnormality data is analyzed, and the process proceeds to step 214 in response to the presence of abnormality, or proceeds to step 204 in the absence of abnormality.

Step 204 judges the end of engine starting, and if engine starting does not end yet, the process returns to step 204. The beginning and end of engine starting may be judged based on the on-state and off-state of the starter control signal, respectively, or may be judged based on the battery current value below a threshold value I1 (−200 amperes in this embodiment) and above another threshold value I2 (−60 amperes in this embodiment), respectively. For example, it is judged that if the starter control signal is on-state, the engine starting is the beginning state, if the starter control signal is off-state, the engine starting is the end state, or if the battery current value is below a threshold value 11, the engine starting is the beginning state, if the battery current value is over a threshold value 12, the engine starting is the end state. Upon completion of engine starting, the process proceeds to step 206.

Step 206 of approximate calculation performs the regression analysis for the former half of the voltage and current data at the time of engine starting thereby to get an approximate formula. This embodiment indicates the following first-degree formula for the sake of simplicity.

[Formula 1]

$$V = OCV + R \cdot x \qquad (1)$$

where V is the battery voltage, OCV is the battery voltage in zero of current, R is the internal resistance of battery, and I is the battery current which is positive at charging.

Figure 7:
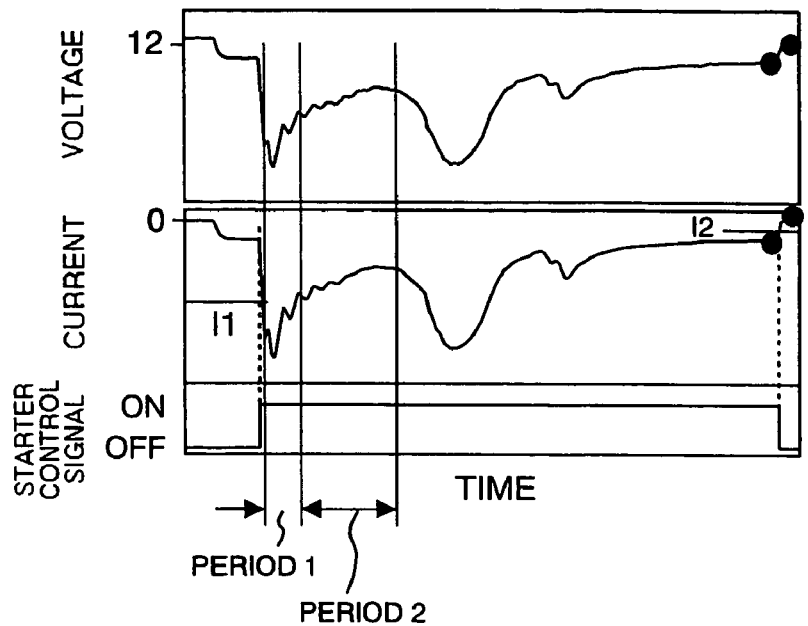
FIG. 7 is an explanatory graph showing the current and voltage waveforms of the battery during the engine start operation.
Figure 8:
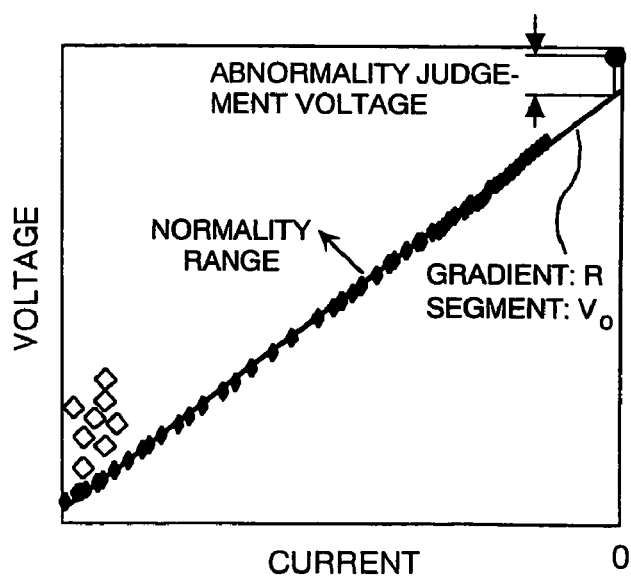
FIG. 8 is an explanatory graph showing the locus of current-voltage characteristics of the battery during the engine start operation.

FIG. 7 shows an example of the battery voltage and current and the starter control signal at the time of engine starting. During period 1 immediately after the beginning of engine starting, the locus of current-voltage characteristics is not stable as indicated by blank rhombic marks on the graph of FIG. 8. Therefore, characteristic data, which is indicated by filled rhombic marks on the graph of FIG. 8, derived from period 2 in FIG. 7 is used to get an approximate line. The period 2 can be set within the former half of the engine starting period, although it is defined to be from 50 ms up to 150 ms following the beginning of engine starting in this embodiment. The time of beginning of engine starting may be based on the control signal of the starter motor 43, or may be derived from the time point when the battery current decreases below the threshold value 11.

Figure 9:
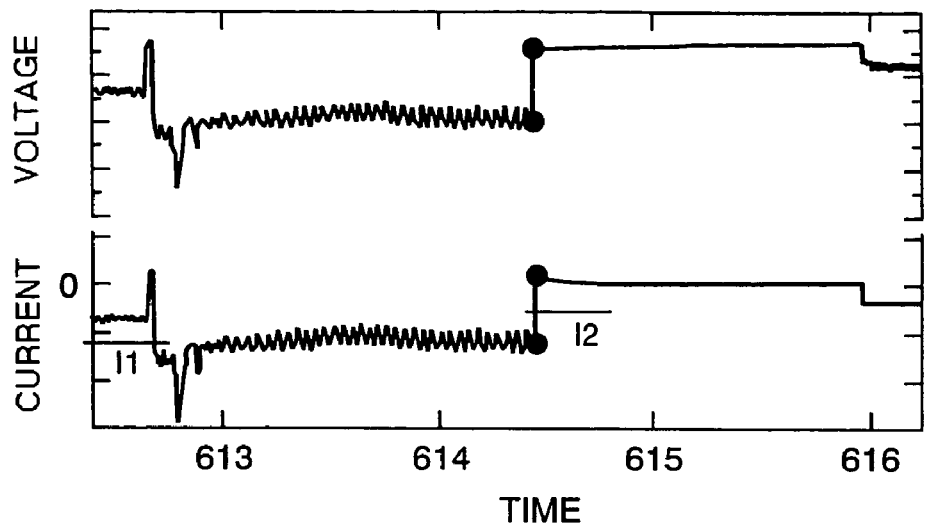
FIG. 9 is an explanatory graph showing the current and voltage waveforms of the battery during the MG operation.
Figure 10:
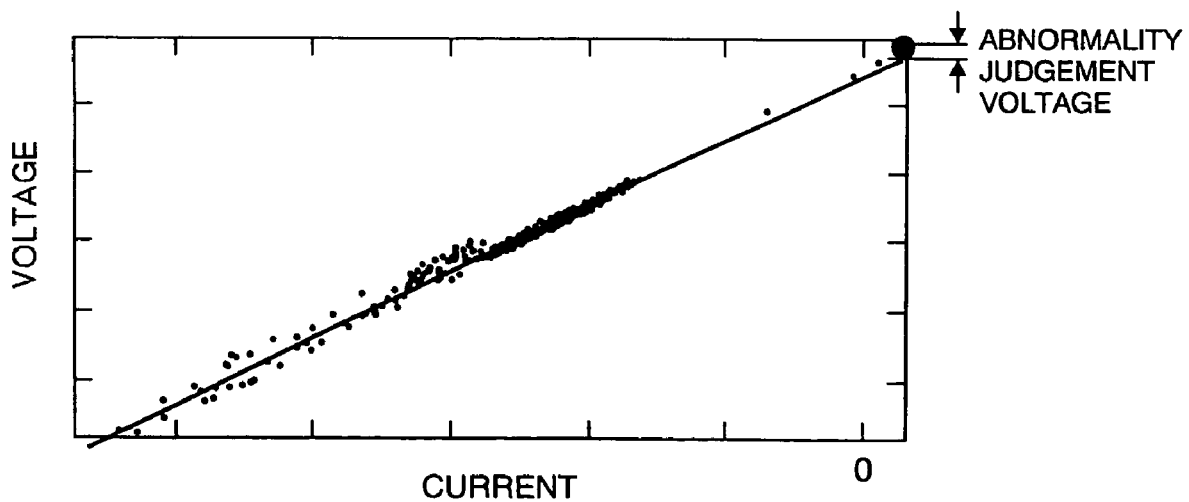
FIG. 10 is an explanatory graph showing the locus of current-voltage characteristics of the battery during the MG operation.

FIG. 9 shows the voltage and current waveforms of the case where an AC motor and inverter are used, instead of a starter motor (DC brush motor) to start the engine. Also in this case, the similar approximate calculation as shown in FIG. 10 can take place.

Subsequently, step 208 of correlation factor calculation analyzes the voltage and current data, which have been used in the approximate calculation, to get the correlation factor r in accordance with the following formula.

[Formula 2]

$$r = \frac{n \sum V \cdot I - \sum V \sum I}{\{n \sum I^2 - (\sum I)^2\}^{1/2} \{n \sum V^2 - (\sum V)^2\}^{1/2}} \qquad (2)$$

where n is the number of approximate data measured during the period 2. Although, in this embodiment, the correlation factor which assesses the deviation from the first-degree formula is used, an alternative manner is based on the approximation by summation (expressed by formula (3)) of the Tafel's formula and the first-degree formula, and the evaluation of square mean value (expressed by formula (4)) of the difference between the approximate formula and the approximate data.

[Formula 3]

$$V = (OCV + a) + R \cdot I + b \ln|I| \qquad (3)$$

[Formula 4]

$$r = \left( \frac{\sum \{(OCV + a) + R \cdot I + b \ln|I| - V\}^2}{n} \right)^{1/2} \qquad (4)$$

where a and b are Tafel's constants having different polarities and values between charging and discharging.

Subsequently, step 210 compares the voltage (indicated by the black dot in FIG. 7 and FIG. 9) immediately before or after the end of engine starting with the previous result of approximate formula, thereby gets the abnormality judgment voltage in terms of the difference of the current-voltage data (indicated by the black dot in FIG. 8) from the approximate line, and sets the over discharge flag if the judgment voltage is out of the normal range. Alternatively, the case of the black dot of FIG. 8 outside the normal range which is above the approximate line (abnormality judgment voltage below 0 volt) may be judged to be abnormal:(scheme 1). The time point of the end of engine starting may be based on the control signal of the starter motor or may be derived from the time point when the battery current exceeds the threshold value I2.

Figure 11:
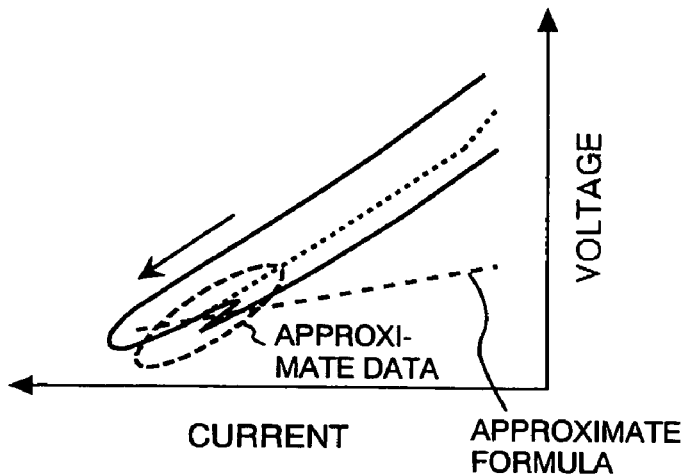
FIG. 11 is a graph showing schematically the locus of current-voltage characteristics of the battery during the engine start operation when the battery is near the state of over discharge.

FIG. 11 shows schematically the locus of current-voltage characteristics of the case of starting operation in a state much closer to the over discharge. For abnormality monitoring of this case, if the calculation result of correlation factor is equal to or below a threshold value, or if the square mean value of the difference between the approximate formula and the approximate data is greater than a reference value, i.e., insufficient matching of the approximate formula and approximate data, the case is judged to be abnormal: (scheme 2).

Figure 12:
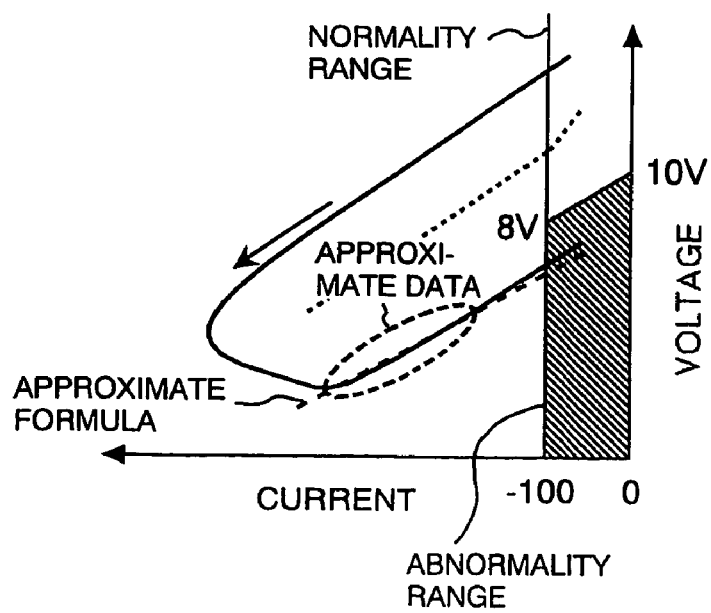
FIG. 12 is a graph showing schematically the locus of current-voltage characteristics of the battery during the engine start operation when the battery has reached the state of over discharge.

FIG. 12 shows schematically the locus of current-voltage characteristics of the case when the battery falls into the state of over discharge. In this case, the approximate formula and data coincide, and accordingly the scheme 1 and scheme 2 cannot be used for abnormality judgment. Therefore, in case the voltage immediately before the end of starting operation enters the abnormality region, the case is judged to be abnormal:(scheme 3).

Although, in this embodiment, data sampled before or after the end of load operation, at which the sensitivity of abnormality judgment is highest, is used to implement the abnormality judgment, the timing of data sampling may be slightly different from the end of load operation provided that the sensitivity of judgment is enough.

Although the scheme 1 of this embodiment compares the current-voltage data sampled immediately before the end of engine starting with the approximate formula, an alternative manner is to use data sampled immediately after the end of engine starting.

Subsequently, step 212 sends the result of abnormality judgment to the indicator device 94 to notify the abnormality to the car driver. At the same time, the result of abnormality judgment is indicated to the high-ranking controller 47, which responds to the indication of battery abnormality to inhibit the automatic shut-off of the engine 45. In other words, it inhibits the power discharge to the starter motor 43, inhibits the halting of power generation of the generator 44, and charges the battery 10 through the predetermined operational sequence.

In the case of a lead battery or lithium ion battery, the generator 44 is operated basically to produce its maximum output, and after the battery voltage has reached the preset upper limit, the generator output is controlled to maintain the upper-limit voltage. After the battery has been charged for about one hour, the inhibition of automatic shut-off of the engine 45, the inhibition of power discharge to the starter motor 43, and the inhibition of halting of power generation are lifted.

In the case of a NiMH battery, the generator 44 is operated to produce a virtually constant output, and when the charge ceasing condition is met, e.g., when the battery temperature rising rate has reached the reference level, the generator output is reduced to a 0.1C current level. After the battery has charged continuously for a certain time length, the inhibition of automatic shut-off of the engine 45 is lifted.

Based on the foregoing controlled charging, all battery cells connected in series are charged. Early charge-up battery cells wait for the charge-up of remaining battery cells, while thermally dissipating their excessive electric energy, and eventually all battery cells are equally charged. These series of processings are implemented in the full-charge judgment step 214 and abnormality flag resetting step 216 of FIG. 6 by the CPU 46.

Step 218 of battery replacement judgment accumulates the current value which has been charged to the battery in each loop cycle of steps 203,214 and 218 after the abnormality emerges until the battery is fully charged. If the cumulated current value at the time when the battery is fully charged and the abnormality flag is reset is smaller than the threshold value, the step 218 sets the battery replacement flag and sends to the high-ranking controller 47 and notifies the need of battery replacement to the driver through the indicator device 94.

If the power capacity of battery, which is assessed by this process in terms of the cumulative current value since the emergence of battery abnormality until the end of full-charging, becomes smaller to indicate the deficient recovery, the battery is judged to expire in its life span and the car driver is prompted to replace it.

Although the foregoing embodiment bases the judgment of battery abnormality on the load current of starter motor, judgment may be based on the current waveform of the power steering device 41 or electric braking device 42 in its activated state. During the operation of the engine 45, when any of these devices having load currents of the order of 100–200 amperes begins to operate, almost entire load current is initially supplied from the battery, and after a delay of around 200 ms in terms of time constant, the load current is shared by the generator 44. Consequently, a current which resembles the current waveform of FIG. 7, but smaller in magnitude, flows through the battery, enabling the judgment of battery abnormality based on the inventive method.

Figure 15:
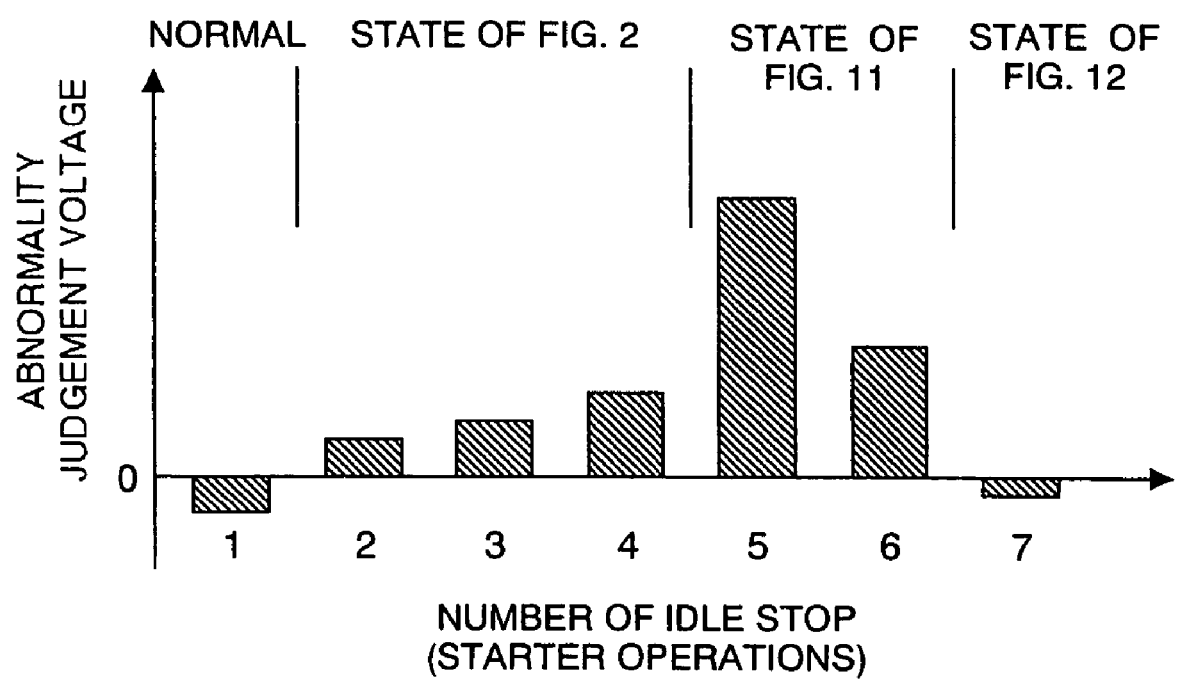
FIG. 15 is a characteristics graph showing the relation between the engine shut-off events and the abnormality judgment voltages during a run of a car which is equipped with the battery controller (battery equipment) based on an embodiment of this invention.

FIG. 15 shows the relation between the number of idle stop (namely starter operating number: repeat number of since engine start until engine shut-off) and the abnormality judgment voltages during a run of a car which is equipped with the inventive equipment. The test was conducted, with the intention of confirming the effectiveness of this invention, by operating the battery to discharge power to become the state of over discharge until it finely fails to start the engine. At the first engine start operation, the locus of current-voltage characteristics was within the normal range. At the second through fourth engine start operations, the locus of current-voltage characteristics were judged to be abnormal based on scheme 1. At the fifth and sixth operations, the locus of current-voltage characteristics were as shown in FIG. 11 and were judged to be abnormal based on both scheme 1 and scheme 2. Although the sixth operation also resulted in an abnormality judgment based on scheme 3, it started the engine successfully. At the seventh operation, the locus of current-voltage characteristics was as shown in FIG. 12 and judged to be abnormal based on scheme 3, and the operation failed to start the engine. Accordingly, it was confirmed that the emergence of battery abnormality can be anticipated before the engine is started a number of times only to encounter the failure of starting eventually.

According to this embodiment, as described above, it is possible to care for the battery by charging properly before one of the serial battery cells falls into the state of over discharge which causes the battery to fail in engine restarting, whereby the battery is maintained always in the readiness state for engine restarting.

Figure 13:
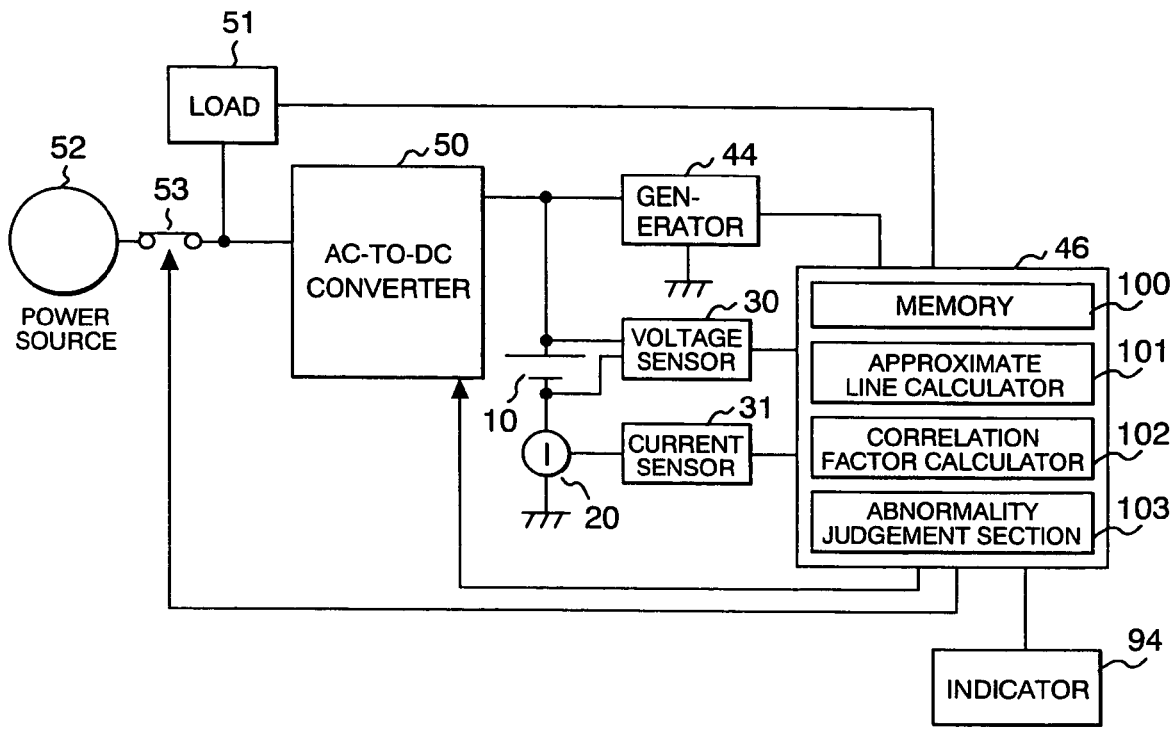
FIG. 13 is a block diagram of a distributed electric power source which is derived from another application of this invention.

FIG. 13 shows another embodiment of this invention which is applied to a distributed electric power source. The following explains only portions different from the configuration of FIG. 5. The power system includes an AC-to-DC converter 50 which converts AC power into DC power and converts DC power into AC power. A commercial power source 52, a switch 53, a load 51 and a generator 44 are connected in the system as shown. The load 51 represents such home appliances as air conditioners, refrigerators, microwave ovens and lighting devices, and such electric facilities as motors, elevators, computers and medical apparatus. Indicated by 94 is an alarming device. These devices may have internal switches. When a large load-current appliance such as an microwave oven or toaster operates several seconds to several minutes at a commercial power frequency of 50 Hz or 60 Hz, a resulting battery current is similar to the case shown in FIG. 9.

When the power consumption of the load 51 is small, the generator 44 or the commercial power source 52 through the AC-to-DC converter 50 charges up the battery 10. In the event of power supply shut-off of the commercial power source 52, the switch 53 is turned and the AC-to-DC converter 50 is controlled so that power is supplied from the battery 10 and generator 44 to the load 51. In case the power consumption of the load 51 is larger than the specified level, power is supplied to the load 51 from the battery 10 or generator 44 by way of the AC-to-DC converter 50. Since the generator 44 is slower in its start operation and its response than the load 51 in its variation of power consumption, momentary load variations are treated by the battery 10 or commercial power source. If the battery output falls below the nominal rating, the load current of commercial power source can possibly exceed the contract, causing the current breaker to operate unfavorably.

The CPU 46 measures the battery current and voltage to judge the abnormality of battery. At the emergence of abnormality, the generator 44 increases the output. The battery 10 is inhibited to discharge power during a period, such as night, when the power consumption is small, and it is charged at the specified rating.

The alarming device 94 indicates the emergence of abnormality and displays the operational state for the user. The CPU 46 may be linked to the server through the communication device so as to request the replacement of battery when the frequency of abnormality occurrence exceeds a preset number.

According to this embodiment, as described above, it is possible to anticipate the output fall of the battery 10 and prevent the battery output from declining, whereby the power system can have enhanced reliability. The system enables the remote monitoring of battery abnormality, and the maintenance of battery of unmanned facilities can be performed properly.

Figure 14:
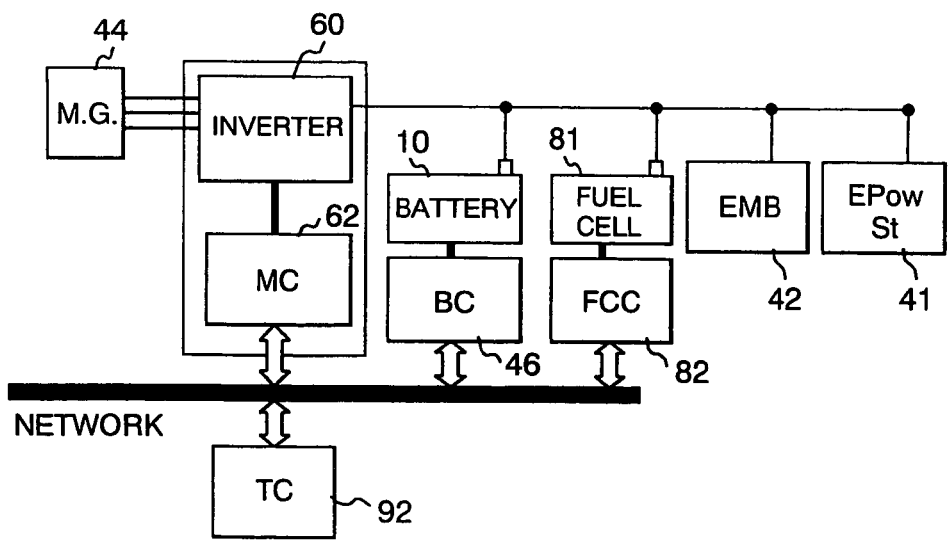
FIG. 14 is a block diagram of an electricity system of a fuel cell car derived from still another application of this invention.

FIG. 14 shows still another embodiment of this invention which is applied to a fuel cell car. The following explains only portions different from the configuration of FIG. 4. The power system employs a fuel cell (FC) 81 in place of the engine as a facility for extracting energy from fuel. The FC 81 is connected to an battery 10, an inverter 60, an EMB 42 and an EPowSt 41. The FC 81 is controlled by being connected to a controller (FCC) 82. The FCC 82 has communication with the total controller 92 via a network to receive a command of fuel cell generation output.

The fuel cell car differs from the conventional car in the arrangement of power train as mentioned above. In order to cover the fuel cell 81 which is inferior in response relative to the engine 45 and generator 44, it is necessary for the battery 10 to supply power at high response to the inverter 60, EMB 42 and EPowSt 41.

The current flowing through the battery 10 is similar to the current resulting from the combinational operations of the EMB 42 or EPowSt 41 and the generator 44 in FIG. 4. At the beginning of operation of the EMB 42 or EPowSt 41, the current is supplied from the battery 10, and after about 1 second in terms of time constant, the current source is switched to the fuel cell 81. As a result, the current flowing through the battery 10 has a waveform which is derived from FIG. 7 and slightly extended along the time axis due to the laggard response of the fuel cell 81.

In case the output of the battery 10 falls due to the emergence of battery abnormality, such unfavorable car behaviors as a deficient acceleration against driver's will and the degraded performance of antilock braking of EMB will result.

According to this embodiment, however, the BC 46 operates similarly to the foregoing MC/BC 40 to anticipate the battery abnormality caused by over discharge and retain the battery output. Moreover, the need of battery replacement is notified to the car driver for practicing the proper battery maintenance, and the above-mentioned impropriety can be prevented.

According to the present invention, it is possible to accomplish a method of performance assessment of a secondary battery and battery equipment which are capable of anticipating the abrupt fall of battery output.

What is claimed is:

1. A method of monitoring the abnormality of battery equipment which stores electric power by being charged and discharges the stored power to a load, the method comprising the steps of:

measuring the voltage and current of the battery equipment at each power discharging to the load;

predicting the recovery pattern of discharge voltage from the peak time of the discharge current of the battery equipment based on the measured voltage and current; and judging the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge.

2. A method of monitoring the abnormality of battery equipment which stores electric power by being charged and discharges the stored power to a load, the method comprising the steps of:

measuring the voltage and current of the battery equipment at each power discharging to the load;

getting an approximate formula of the recovery pattern of discharge voltage from the peak time of the discharge current of the battery equipment based on the measured voltage and current; and judging the battery equipment to be abnormal if the correlation factor between the approximate data used for the calculation of the approximate formula and the approximate formula is equal to or smaller than a threshold value or if the square mean error of the approximate data from the approximate formula is larger than a reference value.

3. Apparatus for monitoring the abnormality of battery equipment, which stores electric power by being charged and discharges the stored power to a load, based on the voltage and current of the battery equipment, wherein the apparatus predicts the recovery pattern of discharge voltage from the peak time of the discharge current of the battery equipment, and judges the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge.

4. Apparatus for monitoring the abnormality of battery equipment, which stores electric power by being charged and discharges the stored power to a load, based on the voltage and current of the battery equipment, the apparatus comprising: a section for monitoring at least the variation of recovering voltage immediately before or after the ceasing of discharge to the load in regard to the discharge voltage recovery characteristics to the discharge current of the battery equipment, and diagnosing the abnormality of the battery equipment; and a battery replacement judgment section which accumulates the value of current which has been charged since the emergence of battery abnormality until the end of full-charging, and indicates the need of battery replacement if the cumulative current value is smaller than a cumulative current judgment value.

5. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment; and
a controller for predicting the recovery pattern of discharge voltage from the peak time of the discharge current of the battery equipment, and judging the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge.

6. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment; and
a controller which takes in the outputs of the voltage sensor and the current sensor and controls the charging and discharging of the battery equipment, the controller monitoring at least the variation of recovering voltage immediately before or after the ceasing of discharge to the load in regard to the discharge voltage recovery characteristics to the discharge current of the battery equipment, and diagnosing the abnormality of the battery equipment;
a battery replacement judgment section which accumulates the value of current which has been charged since the emergence of battery abnormality until the end of full-charging, and indicates the need of battery replacement if the cumulative current value is smaller than a cumulative current judgment value.

7. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment; and
a controller for predicting the recovery pattern of discharge voltage from the peak time of the discharge current of the battery equipment, and judging the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge;
wherein the battery equipment comprises a secondary battery which is installed on a vehicle such as a motor car and used as energy source for engine starting, and the controller comprises a battery controller which controls the energy flow of the starter motor and generator, and the battery system is applied to the drive system of the car.

8. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment;
a controller for predicting the recovery pattern of discharge voltage from the peak time of the discharge current of the battery equipment, and judging the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge;
wherein the battery system is adapted to be applied a distributed electric power source which includes an AC-to-DC converter which charges the battery equipment up to the state of full-charge based on the commercial power source, and an electric generator which supplies, together with the battery equipment, electric power to the load by way of the AC-to-DC converter when the power supply from the commercial power source is shut off, with momentary load variations being treated by the battery equipment.

9. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment; and
a controller for predicting the recovery pattern of discharge voltage from the peak time of the discharge current of the battery equipment, and judging the battery equipment to be abnormal if the discharge voltage which has been measured immediately before or after the ceasing of discharge to the load is lower by a predetermined value than the predicted discharge voltage on the recovery pattern at the same time point as of the discharge voltage immediately before or after the ceasing of discharge;
wherein the drive system of a fuel-cell car which includes a fuel cell which extracts electric power from fuel, and a motor controller which controls a motor based on power from the fuel cell and the battery equipment by way of an inverter, with momentary load variations being treated by the battery equipment the response of which is faster than that of the fuel cell.

10. A battery system comprising:
battery equipment which stores electric power by being charged and discharges the stored power to a load;
a voltage sensor which measures the charging voltage and discharging voltage of the battery equipment;
a current sensor which measures the charging current and discharging current of the battery equipment; and
a controller which takes in the outputs of the voltage sensor and the current sensor and controls the charging and discharging of the battery equipment, the controller monitoring at least the variation of recovering voltage immediately before or after the ceasing of discharge to the load in regard to the discharge voltage recovery characteristics to the discharge current of the battery equipment, and diagnosing the abnormality of the battery equipment; and
a battery replacement judgment section which accumulates the value of current which has been charged since the emergence of battery abnormality until the end of full-charging, and indicates the need of battery replacement if the cumulative current value is smaller than a cumulative current judgment value;

wherein the battery equipment comprises a secondary battery which is installed on a vehicle such as a motor car and used as energy source for engine starting, and a battery controller which controls the energy flow of the starter motor and generator, and the battery system is applied to the drive system of the car.

11. A battery system comprising:

battery equipment which stores electric power by being charged and discharges the stored power to a load;

a voltage sensor which measures the charging voltage and discharging voltage of the battery equipment;

a current sensor which measures the charging current and discharging current of the battery equipment; and a controller which takes in the outputs of the voltage sensor and the current sensor and controls the charging and discharging of the battery equipment, the controller monitoring at least the variation of recovering voltage immediately before or after the ceasing of discharge to the load in regard to the discharge voltage recovery characteristics to the discharge current of the battery equipment, and diagnosing the abnormality of the battery equipment and;

a battery replacement judgment section which accumulates the value of current which has been charged since the emergence of battery abnormality until the end of full-charging, and indicates the need of battery replacement if the cumulative current value is smaller than a cumulative current judgment value;

wherein the battery system is adapted to be applied to a distributed electric power source which includes an AC-to-DC converter which charges the battery equipment up to the state of full-charge based on the commercial power source, and an electric generator which supplies, together with the battery equipment, electric power to the load by way of the AC-to-DC converter when the power supply from the commercial power source is shut off, with momentary load variations being treated by the battery equipment.

12. A battery system comprising:

battery equipment which stores electric power by being charged and discharges the stored power to a load;

a voltage sensor which measures the charging voltage and discharging voltage of the battery equipment;

a current sensor which measures the charging current and discharging current of the battery equipment; and a controller which takes in the outputs of the voltage sensor and the current sensor and controls the charging and discharging of the battery equipment, the controller monitoring at least the variation of recovering voltage immediately before or after the ceasing of discharge to the load in regard to the discharge voltage recovery characteristics to the discharge current of the battery equipment, and diagnosing the abnormality of the battery equipment; and a battery replacement judgment section which accumulates the value of current which has been charged since the emergence of battery abnormality until the end of full-charging, and indicates the need of battery replacement if the cumulative current value is smaller than a cumulative current judgment value;

wherein the battery system is adapted to be applied to a drive system of a fuel-cell car which includes a fuel cell which extracts electric power from fuel, and a motor controller which controls a motor based on power from the fuel cell and the battery equipment by way of an inverter, with momentary load variations being treated by the battery equipment the response of which is faster than that of the fuel cell.

\* \* \* \* \*